United States Patent [19]

Gyarmati et al.

[11] 4,262,039
[45] Apr. 14, 1981

[54] PYROLYTIC GAS METHOD OF COATING GRAPHITIC OR CERAMIC ARTICLES WITH SOLIDS

[75] Inventors: Ernö Gyarmati, Jülich; Hubertüs Nickel, Jülich-Koslar; Ashok K. Gupta, Jülich; Rudolf Münzer, Alsdorf, all of Fed. Rep. of Germany

[73] Assignee: Kernforschungsanlage Jülich Gesellschaft mit beschrankter Haftung, Jülich, Fed. Rep. of Germany

[21] Appl. No.: 934,212

[22] Filed: Aug. 16, 1978

Related U.S. Application Data

[63] Continuation-in-part of Ser. No. 747,057, Dec. 3, 1976, abandoned.

[30] Foreign Application Priority Data

Dec. 5, 1975 [DE] Fed. Rep. of Germany ....... 2554696

[51] Int. Cl.³ ............................................. B05D 3/08
[52] U.S. Cl. .............................. 427/213; 176/91 SP; 427/6; 427/215; 427/249
[58] Field of Search ................... 427/213, 6, 215, 249; 176/91 SP

[56] References Cited

U.S. PATENT DOCUMENTS

| | | | |
|---|---|---|---|
| 3,399,969 | 9/1968 | Bokros et al. | 427/213 X |
| 3,547,676 | 12/1970 | Bokros et al. | 427/213 |
| 3,682,759 | 8/1972 | Beutler et al. | 427/213 X |
| 3,799,790 | 3/1974 | Schulz et al. | 427/213 X |
| 3,940,514 | 2/1976 | Baker et al. | 427/213 |
| 3,977,896 | 8/1976 | Bokros et al. | 427/213 |
| 3,997,689 | 12/1976 | Heruert | 427/213 X |
| 4,016,304 | 4/1977 | Beatty et al. | 427/213 X |
| 4,028,181 | 6/1977 | Huschka et al. | 427/213 X |
| 4,056,641 | 11/1977 | Huschka et al. | 427/213 X |

Primary Examiner—Shrive P. Beck
Attorney, Agent, or Firm—Frishauf, Holtz, Goodman & Woodward

[57] ABSTRACT

A portion of the feed gas is supplied in a pulsating fashion to a fluidized bed reactor containing the articles to be coated mixed with fluidizing particles. The pulse frequency is between 1 and 10 Hz. A continuous flow of a portion of the total gas supply at a rate insufficient to produce turbulence in the bed is provided to facilitate control of the pulsing frequency and reduce the energy necessary for the pulsating gas stream. The gases fed to the reactor are a coating gas and a carrier gas, the flow containing the coating gas including a portion of the carrier gas. Either the pulsed flow or the continuous flow may consist entirely of carrier gas. The fluidizing particles are preferably of the same material as the articles to be coated and are typically of a grain size between 2 and 3 mm.

7 Claims, 2 Drawing Figures

PYROLYTIC GAS METHOD OF COATING GRAPHITIC OR CERAMIC ARTICLES WITH SOLIDS

This application is a continuation-in-part of Ser. No. 747,057, filed on Dec. 3, 1976 now abandoned.

This invention relates to a method for coating graphitic or ceramic particles with solids deposited from thermally decomposable gases, so-called coating gases. The articles to be coated in such a process form, together with fluidizing particles, a layer of loose material through which a gas stream flows which is composed of a coating gas and a carrier gas and is heated to the decomposition temperature of the coating gas.

BACKGROUND AND PRIOR ART

The coating of graphitic or ceramic particles in turbulent layers into which a thermally decomposable gas is introduced is well known. For example, the pyrolytic carbon coating of fuel or breeder kernel materials for nuclear reactors by the introduction of a thermally decomposable gaseous hydrocarbon into a turbulent layer is known, as disclosed in German Pat. No. 1, 808,550. As well as layers of pyrolytic carbon, it is feasible by this method to produce also coatings consisting of other high temperature stable ceramics, or metals, as for example layers of silicon carbide, molybdenum or tungsten. The particular coating material that is deposited and also its structure depend essentially on the nature of the coating gas, on the concentration of the gas components in the gas stream which are decomposed at the decomposition temperature, upon the property of the surface of the articles to be coated, on their temperature and on the total surface of the articles to be coated in the fluidized loose material layer. The commercial value of the process depends primarily upon the formation velocity of the layers and their quality, which must satisfy the requirements of the particular case.

For the coating of larger articles with dimensions of the order of 1 to 30 millimeters with pyrolytic carbon, a process is known that consists in fluidizing the articles to be coated in common with fluidizing particles of a diameter of a few hundred microns ($\mu$m) during exposure to a hot coating gas, as referred to in German published patent application (OS) No. 2 311 791. For the formation of relatively thick layers, it is recommended in this process to maintain constant the aggregate surface of the fluidizing particles in the fluidized bed per unit of time and to supply the fluidizing particles and remove them continuously. The fluidizing particles have an assisting role in this process. Cheap fluidizing particles are used that have a higher density than the articles to be coated. The gas velocities necessary for fluidization are then so high that the articles do not sink, nor do the valves get clogged. It is known from German published patent application (OS) No. 2 311 791 to utilize zirconium oxide particles as fluidizing particles for the coating of graphitic hollow spheres. It is not possible in this case, however, to prevent contamination of the pyrolytic carbon that is deposited, at least in the parts per million range, by zirconium oxide.

If it is desired to produce layers of a high purity and free of any particular contamination, as is especially required for atom absorption spectroscopy, fluidizing particles are preferably employed that are of a material corresponding to the material of the layer to be deposited. Thus, for example, in the production of pyrocarbon layers, fluidizing particles of carbon are utilized. In this case, however, the articles to be coated generally have a higher ratio of weight to surface in comparison with the fluidizing particles, so that the driving force in the turbulent layer produced by the gas stream that is introduced is not sufficient to prevent a separation of the articles to be coated from the fluidizing particles. The articles to be coated sink, while the fluidizing particles, as for example graphite pellets, form the actual fluidized bed somewhat above those articles. It is observed that the undesired separation occurs particularly with an increased loading of the turbulent layer with a larger number of articles to be coated, essentially independent of the flow-through rate of the gas.

It is an object of the present invention to overcome these disadvantages and to devise a coating process in which a larger number of particles to be coated per unit volume of fluidized bed can be coated with a layer of higher quality. It is a further object of the invention to provide such a process in an economic and simple form.

SUMMARY OF THE INVENTION

Briefly, a gas stream that contains a portion of the gas fed to a fluidizable loose material layer is supplied in a pulsating manner. With a pulsating gas stream, it is possible to introduce a much larger number of articles per unit volume of loose material in a most advantageous way, without risk of separation of the articles to be coated from the fluidizing particles during the coating process. It has been found that with the use of a pulsed gas stream there is a logarithmic relation between the number of articles to be coated in the loose material layer and the fluidized volume. In the case of a small volume of fluidizing particles and a small number of articles, the fluidized volume and number of articles have a linearly proportional relation. In the case of large fluidizing volume, the number of articles to be coated can be increased only relatively little. It is advantageous, furthermore, that the coating forms very much faster with a pulsating gas stream without loss of quality compared to the previously known processes.

A pulse frequency between 1 and 10 Hz has been found advantageous for the pulsed gas stream supply, which is preferably a gas stream containing the coating gas and the carrier gas.

A feature of the invention consists of providing a continuous flow of a portion of the gas flow superimposed on the provision of the pulsating gas stream, this superimposed continuous flow of gas flowing through the loose material layer with a velocity lower than the velocity at which turbulence at first sets in. With this type of operation, the friction present in the loose material layer between the fluidizing particles and the articles to be coated is substantially reduced. This is effective not only as a positive factor affecting the energy necessary for the pulsating gas stream, but also makes it easier to control the pulse frequency. The continuous flow may be all carrier gas, or a flow containing all or part of the coating gas, or the latter together with a separately supplied flow of carrier gas.

For coating graphitic articles, graphite particles are utilized advantageously as fluidizing particles, not only for coating processes for forming pyrocarbon layers, but also for coating of articles with other refractory ceramics or with metals, such as, for example, silicon carbide, molybdenum or tungsten. The use of graphite particles in the coating of graphite articles in such cases prevents contamination of the layers formed, or at least to a great extent reduces it. Preferably, graphite particles with a grain size in the region between 2 and 3 mm are used. In a fluidized bed formed with such graphite particles, with a pulse frequency of 3 Hz for the gas stream containing the coating gas and the carrier gas, it is possible to coat articles made of carbon having a length of approximately five times the diameter of the graphite particles, with the weight ratio of the articles to be coated to the graphite particles being of the order of 1:1.

Instead of supplying the coating gas and a part of the carrier gas stream together into the fluidizable bed, a modified version of the process of the invention can be carried out with the continuous supply, at a velocity below the gas velocity that provides the onset of turbulence in the fluidized bed of both coating gas and of a part of the carrier gas stream, while another part of the carrier gas stream is supplied to the fluidizable bed of particles in separate gas conduit at a pulse frequence between 1 and 10 Hz.

The invention is further described by way of example with reference to the annexed drawing showing in the single FIGURE thereof an apparatus and with reference to specific examples given below.

BRIEF DESCRIPTION OF THE DRAWINGS

The invention is further described by way of example with reference to the annexed drawings in which.

DESCRIPTION OF PARTICULAR PREFERRED PROCESSES

Figure 1:
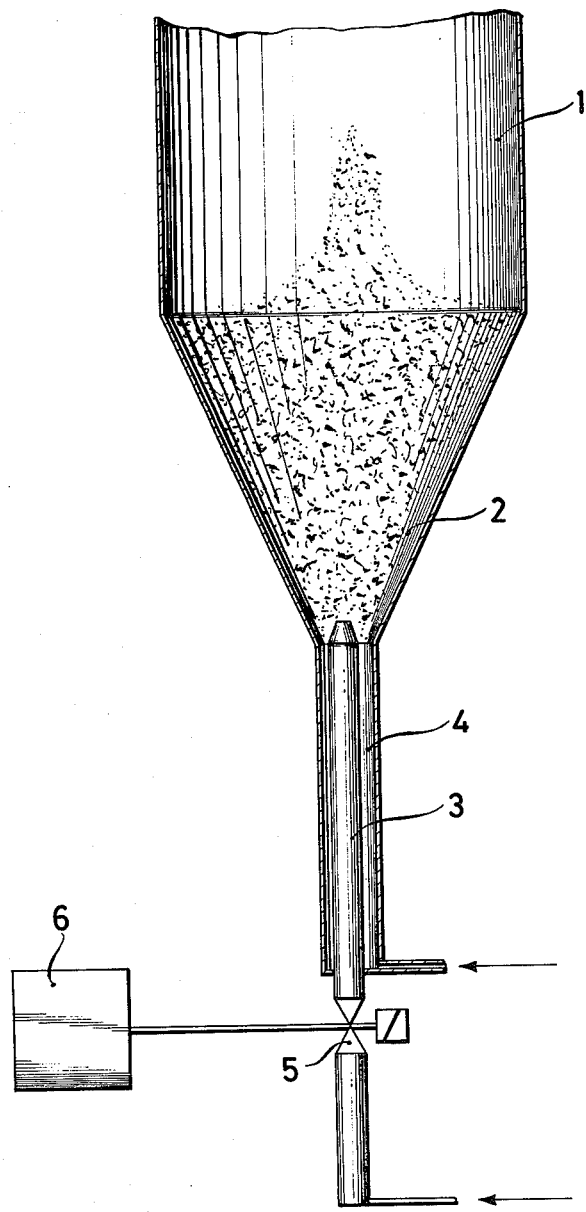
FIG. 1 is a diagramatic representation of an apparatus for carrying out the process of the invention.

As shown in FIG. 1, the coating of the articles takes place in a cylindrically shaped turbulent bed reactor 1, that has a conical bottom 2 tapering downwards, into which gas conduits 3 and 4 upwardly discharge. In the illustrated example, the gas stream containing the coating gas and the carrier gas is introduced through the gas conduit 3 into the fluidized bed reactor 1. The gas conduit 4 surrounds the gas conduit 3 concentrically. Through the annular orifice thus provided between the gas conduit 3 and the reactor wall, carrier gas alone is supplied to the fluidized bed reactor additionally and continuously. The gas velocity of the carrier gas in the annular gap between the outer walls of the conduits 3 and 4 is so adjusted that in the loose material layer in the fluidized bed reactor 1 the gas velocity remains below that which is necessary to produce turbulence.

A valve 5 is inserted in the gas conduit 3 at some distance from its opening into the bottom 2 of the fluidized bed reactor. It is by means of this valve that the gas stream containing the coating gas and an admixture of the carrier gas is supplied in a pulsating manner to the fluidized bed reactor 1. It is preferred to utilize a magnetic valve for the valve 5, that can be periodically opened or closed by means of a control circuit 6 electrically or electronically. The required pulse frequency of the pulsating gas stream is adjustable by means of adjustments (not shown in the drawing) to the control circuit 6. The control circuit 6 may be essentially a multivibrator of adjustable frequency, such circuits being of course well known, even for the relatively low frequencies here involved. Many other types of relaxation oscillators are also suitable.

EXAMPLE I

In a gas stream in which acetylene in a concentration of 10% is present, 240 small graphite tubes of a diameter of 3 mm and a length of 10 mm were coated. 50 grams of graphite grit were added as fluidizing particles to the loose material layer. The graphite particles had a grain size in the region between 2 and 3 mm. The graphite tubes were coated at a temperature of 1300° C. in a gas stream pulsating at the frequency of 3 Hz.

In order to evaluate the layer formed on the graphite tubes, a measuring position was selected at the inner wall of the graphite tubes at which a low formation velocity of the layer was to be expected. In the case of the tubes measured after 60 minutes of coating time with a supply of 1350 liters per hour of pulsating gas, the layer thickness at the place of measuring was between 35 and 40 $\mu$m. In comparison thereto, the average layer thickness at the same measuring position for 80 graphite tubes that were coated in an unpulsed turbulent layer with an addition of 150 grams of graphite grit, with the same gas mixture, only 25 $\mu$m thickness was produced after 165 minutes of gas coating time with a gas flow of 950 liters per hour.

EXAMPLE II

In the same manner as in Example I, 240 graphite tubes, which formed a fluidized bed with 50 grams of graphite grit, were coated with a gas stream pulsed at 3 Hz. The concentration of acetylene in the gas stream was raised to 12.5% at the beginning of coating. After 20 minutes of coating time, the layer thickness at the place of measuring measured between 10 and 20 $\mu$m.

EXAMPLE III

Methyltrichlorsilane was used as the coating gas and hydrogen as the carrier gas. The volume concentration of the methyltrichlorsilane in the gas stream amounted to 2%. The gas stream was supplied to the fluidized bed reactor at a pulse frequency of 8 Hz. The loose material layer was formed of 250 graphite tubes of 3 mm diameter and 10 mm length and 50 grams of graphite grit with a grain size between 2 and 3 mm. At a coating temperature of 1550° C. and a gas flow of 2000 liters per hour, the layer thickness after 60 minutes of coating time reached more than 10 $\mu$m at the place of measuring on the inner wall of the graphite tubes.

EXAMPLE IV

For coating articles with tungsten, tungsten hexachloride was used as the coating gas. The concentration of the coating gas in hydrogen as the carrier gas amounted to 0.5%. The gas stream containing the coating gas and hydrogen was supplied to the fluidized bed reactor at a pulse frequency of 3 Hz. In the reactor, 250 graphite tubes of the dimensions above given together with 50 grams of graphite grit of the grain size above given were coated. At a coating temperature of 700° C. the layer thickness at the measuring point reached more than 10 $\mu$m after 150 minutes of coating time in the same manner as in Example III.

Figure 2:
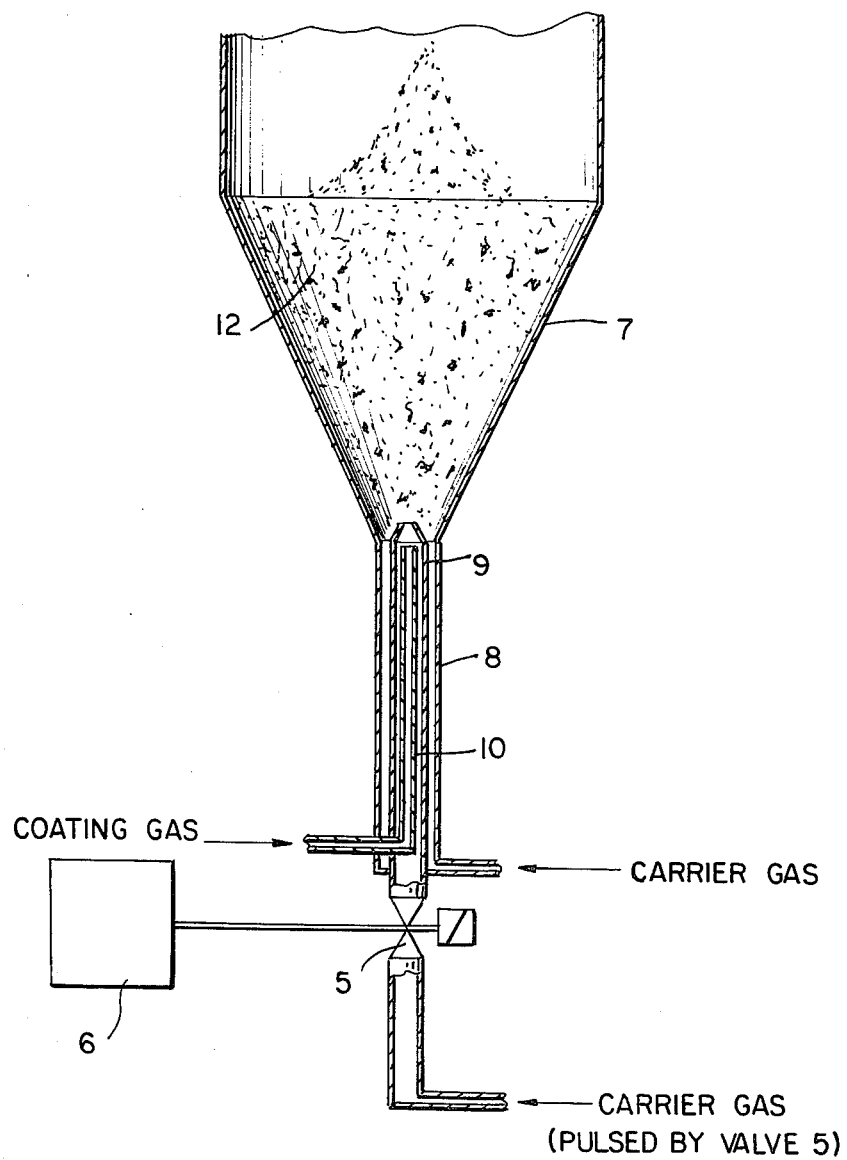
FIG. 2 is a diagramatic representation of another form of apparatus for carrying out a modified form of the process of the invention.

A modified process according to the invention utilizes a reactor of the kind shown in FIG. 2. A bed 12 of loose material capable of becoming a fluidized bed is located in a fluidized bed reactor 7. A continuous stream of carrier gas is supplied to a gas conduit 8 at a velocity below the gas velocity at which turbulence sets in in the bed 12. Centered within the gas conduit 8 is a coaxial gas conduit 9 for another stream of carrier gas that is supplied in a pulsating manner to the fluidized bed reactor 7, rather than continuously. Within the gas conduit 9 is still another coaxial gas conduit 10 for the coating gas that is introduced continuously into the bed of loose material of the fluidized bed reactor just as the carrier gas stream in the gas conduit 8, which is to say that the rate of flow of the coating gas in the carrier 10 and that of the carrier gas in the conduit 8 together are insufficient to cause turbulence to be produced in the loose material layer in the fluidized bed reactor.

EXAMPLE V

In the apparatus of FIG. 2, 240 tubular pieces of graphite, having a diameter of 3 mm and a length of 10 mm, were coated with carbon. The coating gas was a continuously supplied gas stream with a content of 10% by volume of acetylene that served as the decomposing component of the gas. 50 g of graphite grit were added to the tubular graphite pieces, to serve as fluidizing particles. The graphite particles had grain sizes in the region between 2 and 3 mm. The graphite tubes were coated at a temperature of 1300° C. in a carrier gas stream of nitrogen. A portion of the carrier gas stream was supplied to the fluidizable bed through the gas conduit 9 at a pulse frequency of 3 Hz. When this part of the carrier gas stream was not being supplied, there was no turbulence in the particle bed in the apparatus 7. After 20 minutes of coating time, during which the pulsating stream of part of the carrier gas was being supplied, the coating thickness at the place of measurement of the tubular graphite particles was between 10 and 20 μm.

Coating of particles was also carried out in the apparatus of FIG. 2 in a manner analogous to Examples 2, 3 and 4. The same results were obtainable in these cases as in Examples 2, 3 and 4.

For the carrier gas, instead of or in addition to nitrogen, it is possible to use other gases that do not affect or enter into the coating reaction, such as noble gases or hydrogen, with similar results.

Although the invention has been described with reference to particular specific examples, modifications and variations are possible within the inventive concept.

We claim:

1. A method of coating objects made of ceramic or graphitic material with a solid deposited from a thermally decomposable gas comprising the steps of:

placing objects to be coated in a loose mass of solid particles capable of forming a fluidized bed with gas flow supplied from below in a container having means for feeding at least one gas flow from below through at least one orifice at the bottom of said container said objects having a length dimension which, at least, is a few times the maximum size dimension of said particles;

passing a first gas from said feeding means through said mass of particles containing said objects in intermittent pulses of gas flow at a pulsing frequency between 1 Hz and 10 Hz, thereby fluidizing the bed of said particles containing said object during the pulses of said intermittent gas flow; and passing a continuous flow of at least one other gas through said loose mass of solid particles, which continuous flow is superimposed on and intermittently mixed with said pulses of gas flow, said superimposed continuous flow being at a velocity lower than the minimum velocity at which turbulence of said particles sets in to fluidize said mass of particles;

one of said gas flows being a flow containing said thermally decomposable gas, and every other of said gas flows containing only carrier gas which is inert with respect to said thermally decomposable gas and with respect to said particles;

the temperature at which said gases are passed through said mass of particles being a temperature at which said thermally decomposable gas decomposes.

2. A method as defined in claim 1 in which said first gas is a mixture of said thermally decomposable gas and carrier gas which is inert with respect to said thermally decomposable gas and with respect to said particles.

3. A method as defined in claim 1 in which said first gas contains only a carrier gas which is inert with respect to said thermally decomposable gas and in which there are provided a continuous flow of a mixture of said thermally decomposable gas and said carrier gas and a separately supplied continuous flow of said carrier gas.

4. A method as defined in any one of claims 1, 2 or 3, in which said objects to be coated are of graphitic material and said solid particles of said mass are graphite particles.

5. A method as defined in any one of claims 1, 2 or 3, in which said objects to be coated are of graphitic material and said solid particles of said mass are of a grain size between 2 and 3 mm.

6. A method as defined in any one of claims 1, 2 or 3 in which said objects are of a length about five times the diameter of said particles of said mass.

7. A method as defined in any one of claims 1, 2 or 3 in which the weight ratio of said objects to be coated to the particles of said mass is of the order of 1:1.

* * * * *